United States Patent [19]
Woo

[11] Patent Number: 5,470,772
[45] Date of Patent: Nov. 28, 1995

[54] SILICIDATION METHOD FOR CONTACTLESS EPROM RELATED DEVICES

[75] Inventor: Been-Jon Woo, Saratoga, Calif.

[73] Assignee: Intel Corporation, Santa Clara, Calif.

[21] Appl. No.: 67,269

[22] Filed: May 24, 1993

Related U.S. Application Data

[63] Continuation of Ser. No. 788,351, Nov. 6, 1991, abandoned.

[51] Int. Cl.$^6$ .................................................. H01L 21/8247
[52] U.S. Cl. .......................... 437/43; 437/200; 437/984
[58] Field of Search ................................ 437/43, 200, 48, 437/52, 984; 257/412, 413

[56] References Cited

U.S. PATENT DOCUMENTS

| | | | |
|---|---|---|---|
| 4,635,347 | 1/1987 | Lien et al. | 437/200 |
| 4,746,219 | 5/1988 | Holloway et al. | 437/200 |
| 4,784,971 | 11/1988 | Chiu et al. | 437/193 |
| 4,886,765 | 12/1989 | Chen et al. | 437/56 |
| 4,997,790 | 3/1991 | Woo et al. | 437/195 |
| 5,051,796 | 9/1991 | Gill | 357/23.5 |
| 5,069,747 | 12/1991 | Cathey et al. | 156/643 |
| 5,081,056 | 1/1992 | Mazzali et al. | 437/43 |
| 5,089,442 | 2/1992 | Ohmer | 437/228 |
| 5,160,986 | 11/1992 | Bellezza | 365/185 |

FOREIGN PATENT DOCUMENTS

| | | | |
|---|---|---|---|
| 3222805 | 1/1983 | Germany | 437/192 |

OTHER PUBLICATIONS

Wolf, "Silicon Processing for the VLSI Era", vol. II, pp. 222–224, 1990.

Wolf, "Silicon Processing for the VLSI Era, vol. II: Process Integration", ©Jun./1990 pp. 144–150.

*Primary Examiner*—Olik Chaudhuri
*Assistant Examiner*—Richard A. Booth
*Attorney, Agent, or Firm*—Blakely, Sokoloff, Taylor & Zafman

[57] ABSTRACT

A process for fabricating contactless electrically programmable and electrically erasable memory cells of the flash contactless EPROM or EEPROM type. The array of memory cells in these devices have elongated, parallel source and drain regions disposed beneath field oxide regions. The word lines are elongated, parallel strips of polysilicon. A series of SiO$_2$ depositions using TEOS chemistry in a PECVD process, and etches using sputter etch and plasma processes, is performed. After deposition and etchback, the polysilicon word lines remain exposed while all previous exposed substrate regions between source and drain are covered with SiO$_2$. A metal deposition and silicidation are performed forming a silicide on the exposed silicon word lines thereby lowering the resistance of the word lines. Since the substrate regions between source and drain is covered between SiO$_2$ prior to metal deposition and silicidation no silicide is formed in these regions. Therefore the word lines are silicidized in a self aligned process with no need for a photolithographic step after SiO$_2$ deposition.

24 Claims, 7 Drawing Sheets

SILICIDATION METHOD FOR CONTACTLESS EPROM RELATED DEVICES

This is a continuation of application Ser. No. 07/788,351, filed Nov. 6, 1991, now abandoned.

BACKGROUND OF THE PRESENT INVENTION

1. Field of the Invention

The invention relates to the field of semiconductor memory devices employing floating gates and the processes and methods for fabricating these devices.

2. Prior Art:

One class of non-volatile semiconductor memories employs floating gates, that is, gates which are completely surrounded by an insulative layer such as silicon dioxide. Typically, a polycrystalline silicon (polysilicon) layer is used to form floating gates. These gates are electrically charged, most often with electrons by transferring charge into and from the gates through a variety of mechanisms. The presence or absence of this charge represents stored, binary information. An early example of such a device is shown in U.S. Pat. No. 3,500,142.

A recent category of floating gate memory devices uses channel injection for charging floating gates and tunneling for removing charge from the gates. Here, each memory cell comprises only a single device and the entire memory array is erased at one time, that is, individual cells or groups of cells are not separately erasable as in current EEPROMs. These memories are sometimes referred to as "flash" EPROMs or "flash" EEPROMs.

U.S. Pat. No. 4,780,424 provides a process for fabricating a buried bit line device which avoids the increased capacitance of the prior art cells. This process includes fabricating contactless electrically programmable and electrically erasable memory cells. Elongated source and drain regions are formed, and then field oxide is grown on top of the source and drain regions. The drain regions are shallow compared to the source regions. Furthermore, the source regions have more graded junctions. The floating gates are formed over a tunnel oxide between the source and drain regions with word lines being disposed perpendicular to the source and drain regions. One dimension of the floating gate is formed simultaneously and in alignment with the word lines.

One problem with the fabrication of the flash contactless EPROMs or EEPROMs is that the processing is not compatible with self-aligned silicide technology. In the fabrication of other semiconductor devices, for example MOS transistors, this technology is used extensively. For example, during the fabrication of a MOS transistor, a refractory metal such as titanium can be deposited on the entire substrate surface. The substrate will next be put through a silicidation step, which will typically be accomplished by heating in an inert ambient or by rapid thermal annealing (RTA). The refractory metal will react with any exposed silicon or polysilicon to form a refractory metal silicide. The exposed silicon regions in the case of a MOS device where the silicide is formed are the same regions where the silicide is desired. Typically, this will be the gates and the source and drain regions. The refractory metal deposited on areas of the substrate which are not exposed silicon will either remain unreacted or will form a refractory metal nitride if the silicidation step is performed in a nitrogen ambient. A selective etch will then remove the unreacted refractory metal or refractory metal nitride while leaving the refractory metal silicide in place. Thus, the process forms a silicide on all regions where the silicide is desired, while removing all refractory metal from the other regions without a masking step. Since no masking step is needed, the process is self-aligned.

In the case of flash contactless EPROMs or EEPROMs, unlike the MOS transistor, there are regions of exposed silicon where no silicide is desired. These devices have elongated, parallel, alternating source and drain regions. Running perpendicular to these source and drain regions are elongated parallel polysilicon word lines. While it is desirable for the polysilicon word lines to be silicidized in order to lower their resistance, the regions bounded by the source and drain in one direction and the word lines in the other cannot be silicidized, as this would cause source to drain shorting. Unfortunately, these regions are exposed silicon at the stage of processing when the polysilicon word lines must be silicidized, so that self-aligned silicidation cannot be used in order to lower the resistance of the word line.

To overcome this problem, a blanket layer of silicon dioxide ($SiO_2$) can be deposited, the exposed silicon regions where no silicide is desired can then be masked, and an etch performed to remove the $SiO_2$ from all other regions of the substrate. Following this, the silicidation can be performed. However, this method is an unsatisfactory solution since it involves a deposition, masking and etch step in addition to the self-aligned silicide processing. Instead, the lowering of the resistance of the word lines is typically accomplished by first depositing a refractory metal silicide on the substrate surface. This is followed by a masking step and an etch step to leave the silicide on the word lines and nowhere else. Typically, tungsten silicide ($WSi_2$) is used, even though it has a higher resistance than, e.g., titanium silicide ($TiSi_2$). Titanium silicide is not used because, although it is desirable for its low resistance, it is much more difficult to etch than tungsten silicide. As an alternative to the deposition of a refractory metal followed by masking and etch, a heavily doped polysilicon can be used for the word lines. Although this method has the advantage of not requiring an additional masking and etch step, the resistance of heavily doped polysilicon is higher than any of the refractory metal silicides.

In addition to the processing advantages that self aligned silicidation offers, it is further desirous to use this technology during the contactless EPROM or flash EPROM manufacturing because it can be performed for the memory array simultaneously with the silicidation step of the peripheral circuits, thus further reducing processing steps.

What is needed is a process for fabricating flash array contactless EPROMs or EEPROMs which is compatible with self-aligned silicide technology. It is further desirable that any such process does not involve additional masking steps.

SUMMARY OF THE INVENTION

A process for fabricating contactless electrically programmable and electrically erasable floating gate memory devices is described. The process of the present invention is compatible with self aligned silicide ("salicide") technology.

The present invention is practiced on floating gate memory devices of the flash contactless EPROM or EEPROM type. The array of devices of this type comprises elongated parallel spaced-apart polysilicon word lines and elongated parallel spaced-apart alternating buried sources and drains. After formation of the polysilicon word lines, there are regions of exposed silicon bounded by the two adjacent word lines, a source and a drain.

In the present invention the self aligned silicidation step is performed to decrease the resistance of the word lines. In order to prevent silicidation of the exposed silicon substrate regions and the consequent source to drain shorting, a series of $SiO_2$ depositions and etchbacks are preformed. The word lines bounding these exposed regions are at a height of 0.5 microns, and are spaced approximately 0.5–1.0 micron apart. The sequence of depositions and etchbacks is designed to fill these regions. That is, to form a relatively planar $SiO_2$ surface above the array. During the final etchback, enough $SiO_2$ is removed to expose the word lines, while leaving some $SiO_2$ in regions between the word lines.

First, a PECVD deposition of approximately 3000 Å, of $SiO_2$ using TEOS chemistry is performed. Next, approximately one half of the thickness of this layer is removed by sputtering. A second deposition of approximately 2.5 to 3 microns of $SiO_2$ using TEOS chemistry is preformed. Finally, a plasma etch using $CF_4$ and $O_2$ is performed to remove sufficient $SiO_2$ to expose the word lines while leaving the previously exposed Silicon regions filled with $SiO_2$.

Finally, a layer of silicide forming metal such as titanium is deposited on the substrate. A silicidation step is performed by heating the substrate in an inert ambient or by rapid thermal annealing to form a silicide on the word lines, thereby lowering their resistance. Since the regions between the word lines and the sources said drains are now covered with $SiO_2$, no silicide is formed in these regions. After the silicidation step a selective etch is performed to remove all unsilicidized metal from all other regions of the substrate while leaving the silicide on the word lines.

DETAILED DESCRIPTION OF THE PRESENT INVENTION

A process for fabricating electrically programmable and electrically erasable floating gate memory devices is described. In the following description, numerous specific details are set forth such as specific doping levels, etc., in order to provide a thorough understanding of the present invention. It will be obvious, however, to one skilled in the art that these specific details need not be employed to practice the present invention. In other instances, well-known processing steps are not described in detail in order not to obscure unnecessarily the present invention.

The memory cells of the present invention are fabricated using standard metal-oxide-semiconductor (MOS) processing. The array which contains the cells, in the currently preferred embodiment is fabricated of n-channel devices on a p-type substrate. The peripheral circuits can employ either n-channel devices or complementary MOS (CMOS) devices. However, the present invention can also be used to fabricate an array of p-channel devices on an n-type substrate, with the peripheral circuits employing either p-channel or CMOS devices.

Figure 1:
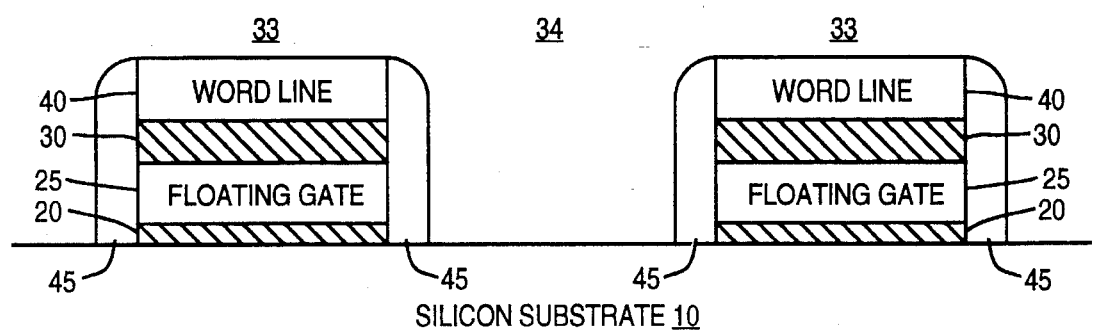
FIG. 1 is a cross-sectional elevation view of a semiconductor substrate with a tunnel oxide layer, a polysilicon floating gate, an insulating layer and a polysilicon word line formed thereon.

Referring to FIG. 1, a cross-sectional elevation view of a portion of a buried bit line EEPROM device during fabrication is shown. In the following description and Figures it will be understood that only a small portion of the semiconductor substrate is described or shown. The structures in the regions 33 of FIG. 1 comprise a tunnel oxide 20 disposed directly on silicon substrate 10. Disposed on top of the tunnel oxide 20 is the floating gate 25. On top of floating gate 25 is insulating layer 30. Above insulating layer 30 is polysilicon word line 40. In the currently preferred embodiment tunnel oxide 20 is made of silicon dioxide ($SiO_2$) with a thickness of approximately 110 Å. Floating gate 25 is made of doped polysilicon with a thickness of approximately 1500 Å. Also in the currently preferred embodiment, insulating layer 30 is a multi-layer structure comprising a first oxide layer, a silicon nitride layer and a second oxide layer. The total electrical thickness of insulating layer 30 is in the range of approximately 150–200 Å. Polysilicon layer 40 is disposed on top of insulating layer 30. Polysilicon layer 40 has a thickness of approximately 3000 Å and runs in long strips perpendicular to the plane of FIG. 1. Floating gate 25 and insulating layer 30 are disposed over the channel region and slightly overlap the source and drain region of each cell. Tunnel oxide 20 extends to a self aligned thick oxide 26 (not shown) which is disposed over the source and drain. Also shown in FIG. 1 is spacer 45. Spacer 45 is made of $SiO_2$ in the currently preferred embodiment. Alternatively, spacer 45 may be made of silicon nitride ($Si_3N_4$). In the currently preferred embodiment spacer 45 is formed by first conformally depositing approximately 2000–2500 Å of $SiO_2$ by atmospheric pressure chemical vapor deposition (APCVD) on the entire substrate 10. Next, an anisotropic etchback by reactive ion etching (RIE) or plasma etching is performed to remove the entire thickness of $SiO_2$. After this deposition and etchback spacer 45 will remain on the sides of the structures of FIG. 1 as shown in that Figure due to the conformal APCVD $SiO_2$ deposition. Generally, if 2000–2500 Å of $SiO_2$ is deposited, the thickness of spacer 45 will be approximately 1500–2000 Å. The structures of FIG. 1 are formed by methods well known by persons skilled in the art.

Figure 2:
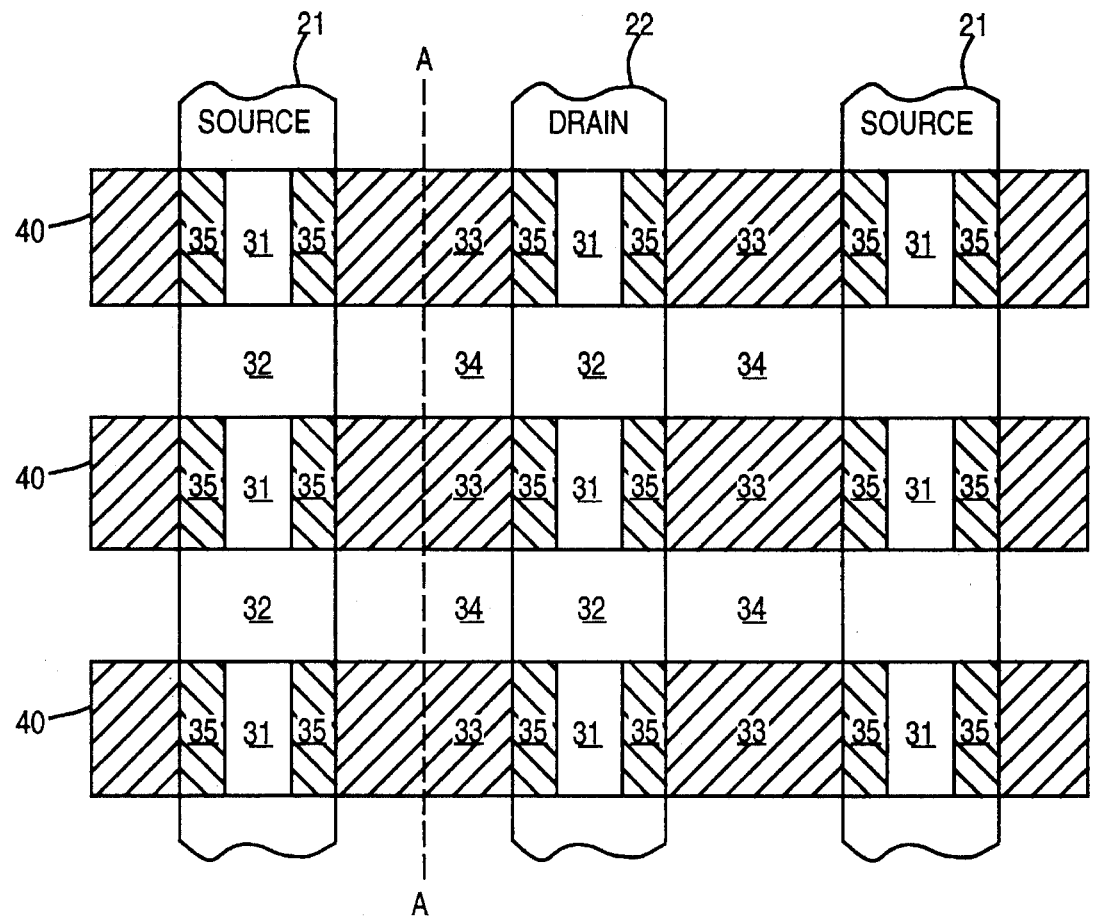
FIG. 2 is a plan view of the semiconductor substrate of FIG. 1.

FIG. 2 shows the top view of the device upon which the present invention is practiced in the currently preferred embodiment. The location of the cross sectional view of FIG. 1 is shown by the line marked A—A. The cross sectional view of FIG. 1 shows only 2 of the 3 polysilicon word lines 40 crossed by the line A—A in FIG. 2. As can been seen from FIG. 2, word lines 40 are continuous, elongated, parallel strips which are perpendicular to and cross over source regions 21 and drain regions 22. The region of silicon substrate 10 between source regions 21 and drain regions 22 is known as the channel region of the device. It is in this region that electrons flow from floating gate to source during erase and from drain to floating gate during programming.

Referring to FIG. 2, various regions 31 through 35 are shown. The regions 31 through 35 are not necessarily structures on the surface of silicon substrate 10. Rather, these regions are identified in reference to the cross-sectional make-up of the device at the stage in processing shown in FIG. 1 in each of the identified regions 31–35 shown in FIG. 2. Regions 31–35 are identified separately because the underlying structure in each of these regions is different. Regions 33 and 34 of FIG. 2 have also been identified on FIG. 1. Spacer 45 of FIG. 1 is not shown on FIG. 2 for convenience. Spacer 45, if shown on FIG. 2, would run alongside the upper and lower edge of the polysilicon word lines 40.

In the regions 31, polysilicon word line 40 is the uppermost structure. Underlying polysilicon word line 40 is a self-aligned thick oxide 26 (not shown) made of silicon dioxide ($SiO_2$). The thickness of serf-aligned thick oxide 26 is approximately 2000 Å. Underneath self-aligned thick oxide 26 in the regions 31 is either the source 21 or the drain 22. Under the source 21 or drain 22 is the silicon substrate 10. In the regions identified as 33, polysilicon word line 40 is again the upper-most structure. Underlying polysilicon word line 40 is insulating layer 30. Underneath insulating layer 30 is floating gate 25. Under floating gate 25 is tunnel oxide 20 and under tunnel oxide 20 is silicon substrate 10.

Floating gate 25 and insulating layer 30 are not completely confined to the regions 33 but slightly overlap source 21 on one side and drain 22 on the other. The regions where floating gate 25 and insulating layer 30 overlie either a source 21 or a drain 22 are shown as regions 35. Thus, in the regions 35 underlying word line 40 is insulating layer 30 and floating gate 25. Under floating gate 25 is self-aligned thick oxide 26, then either source 21 or drain 22. Under the source 21 or drain 22 is the silicon substrate 10.

In the regions 32, the upper most surface is the self-aligned thick oxide 26. Beneath self-aligned thick oxide 26 is either source 21 or drain 22. Underlying the source 21 or drain 22 is the silicon substrate 10. In regions 34 silicon substrate 10 is the upper most surface. That is, silicon substrate 10 is exposed in the regions 34. The regions 34 will have had approximately 110 Å of $SiO_2$ after tunnel oxide deposition. However, after processing to define the word lines 40, approximately one half of this $SiO_2$ is etched. After the spacers 45 are formed, all $SiO_2$ in the regions 34 has been removed, exposing silicon substrate 10 in the regions 34.

The structure shown in FIGS. 1 and 2 can be formed by the methods disclosed in the patents referred to in the background section, by other well known methods, or by the methods disclosed in pending application Ser. No. 563,098, now U.S. Pat. No. 5,077,230, now abandoned and Ser. No. 609,192, now U.S. Pat. No. 5,102,814 which applications are assigned to the assignee of As previously discussed word lines 40 are made of polysilicon. It is desirable to decrease the electrical resistance of word line 40 in order to improve device performance. As stated in the background section, this is normally done by depositing a blanket tungsten silicide layer, masking the word lines 40, and etching the tungsten silicide from all regions except word lines 40. Although titanium silicide would have a lower resistance, it is not generally used because the etch of titanium silicide is difficult in practice. Alternatively, word lines 40 can be made of heavily doped polysilicon. Although this has the advantage of eliminating the extra deposition, masking and etch step, this method results in a higher resistance than the tungsten silicide approach.

Normally, it would be preferred to use self-aligned silicide technology. That is blanket deposit a layer of metal (preferably titanium because of the low resistance of titanium silicide) and then anneal the substrate to form a metal silicide in regions where the metal is in contact with silicon or polysilicon. Next, perform a selective etch to remove unreacted metal from all other regions and leave the metal silicide in-place. As previously discussed, this technology is referred to as self-aligned because it forms a metal silicide in the regions where it is desired, and allows the removal of the unreacted metal from all other regions without a masking step.

As can be seen from FIGS. 1 and 2, this technology is not feasible for the flash contactless EPROMs or EEPROMs. In these devices, it is necessary to silicidize only word lines 40. However, if a refractory metal deposit followed by silicidation is performed, a refractory metal silicide will be formed in the regions 34 as well as on the word lines 40. This would render the device completely nonfunctional, as the refractory metal silicide in regions 34 would electrically connect and therefore short out the alternating sources 21 and drains 22. Of course, regions 32 present no problem as the exposed material in this region is silicon dioxide. Therefore, in these regions no silicide will be formed and the refractory metal will be removed in the selective etch. Therefore, if silicide formation can prevented in the regions 34, then self-aligned silicide technology can be utilized in order to silicidize word lines 40 and thereby lower the resistance of the word lines 40.

In order to accomplish a self-aligned silicidation of word lines 40, without unwanted silicidation occurring in the regions 34, the regions 34 are covered with $SiO_2$ before the silicidation step. In order to cover the regions 34 with $SiO_2$ while leaving the polysilicon of the word lines 40 exposed, without the use of a masking step, the structures of FIGS. 1 and 2 are processed through a sequence of $SiO_2$ deposition and etchback steps as described below in conjunction with FIGS. 3–7 in the present invention.

The deposition and etch steps are designed to leave sufficient $SiO_2$ in regions 34, while removing all $SiO_2$ from word lines 40. Generally, no silicidation will occur if there is at least 200 Å of $SiO_2$ in the regions 34. In order to eliminate the need for a masking step, the $SiO_2$ must be deposited to a greater height above the surface of the array in the regions 34 of FIGS. 1 and 2, than above the word lines 40 of FIG. 1 (regions 31, 33 and 35 of FIG. 2). That is, the $SiO_2$ must fill the gaps between adjacent word lines 40.

The success of a deposition process can be measured by the difference between the $SiO_2$ height in regions 34 and the $SiO_2$ height on the word lines. A large difference is desirable since then it is possible to etch back all $SiO_2$ from the word lines 40 while leaving sufficient $SiO_2$ in the regions 34. For a given deposition sequence, the difference in $SiO_2$ height between the word lines 40 and the regions 34 varies inversely with the width of the spacing between word fines 40 ("gap width"). Thus, a greater $SiO_2$ height difference will occur when the space between word lines 40 is small. The preferred deposition and etch sequence described below will produce a sufficient height difference to prevent silicidation in the regions 34 while allowing complete removal of $SiO_2$ from the word lines 40 when the spacing between the adjacent word lines 40 is approximately 1.6 microns or smaller. Since the $SiO_2$ height difference varies with gap width, all widths on a given substrate should be sufficiently uniform to allow sufficient $SiO_2$ to remain in the gaps after etch back while allowing for complete removal of the $SiO_2$ from the area to be silicidized.

In the device on which the present invention is practiced, all regions 34 of substrate 10 where silicide formation must be prevented are approximately the same dimension. In the currently preferred embodiment, the distance from one word line 40 to the next word line 40 is approximately 0.8–1.2 microns. It is to be expected that in future devices this dimension will decrease as the cell size is scaled down. As noted above, the resultant smaller gap size will make gap filling easier and allow for greater latitude in which the present invention can be practiced. Also in the currently preferred embodiment, the height of the word lines 40 above regions 34 is approximately 4500 Å.

In the currently preferring embodiment of the present invention the $SiO_2$ is deposited using tetraethyl orthosilicate (TEOS) chemistry. Also in the currently preferred embodiment a plasma enhanced chemical vapor deposition (PECVD) process is used. The term PTEOS is used to denote $SiO_2$ deposited in a PECVD process using TEOS chemistry.

In a currently preferred embodiment of the present invention all deposition and etch steps are carded out in the Applied Materials Precision 5000 CVD system.

Figure 3:
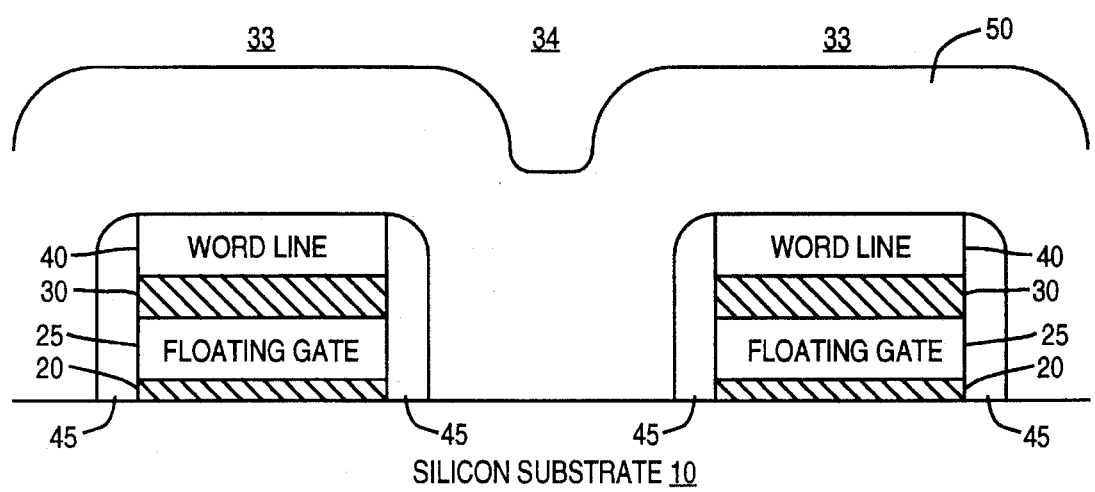
FIG. 3 is the structure of FIGS. 1 and 2 after deposition of a first silicon dioxide layer.

Referring to FIG. 3, the structure of FIGS. 1 and 2 undergoes a PTEOS deposition of $SiO_2$ to form $SiO_2$ layer 50. The thickness of $SiO_2$ layer 50 in the currently preferred embodiment of the present invention is approximately 0.3–0.4 microns. The deposition of $SiO_2$ layer 50 is performed in the currently preferred embodiment by flowing approximately 500 to 700 standard cubic centimeters per minutes (SCCM) of Oxygen and approximately 600 to 800 SCCM of TEOS vapor into the reaction chamber containing semiconductor substrate 10. The TEOS may be vaporized by flowing an inert gas such a helium through liquid TEOS which is heated to a temperature in the range of 35° C. to 45° C.

Figure 4:
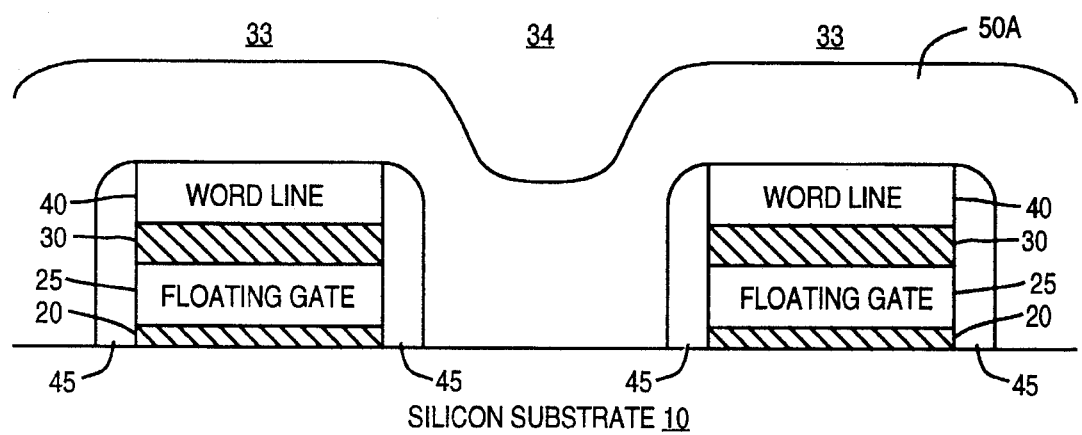
FIG. 4 is the structure of FIG. 3 after a partial etch of the fast silicon dioxide layer.

Following the first PTEOS $SiO_2$ deposition an argon sputter etch is performed. In the currently preferred embodiment the etchback is carried out for 200 seconds at a power of approximately 450 W and a pressure of 100 mTorr. This etchback will remove approximately 500–700 Å of the $SiO_2$ deposited by the fast PTEOS deposition. Since the etchback will remove more of the $SiO_2$ from the tops of the word lines 40 and other flat surfaces of the substrate than the gaps, the effect is be to remove more $SiO_2$ from the regions 33 than the regions 34 thus helping to fill the gaps. The resulting structure after the etchback is shown in FIG. 4. $SiO_2$ layer 50a of FIG. 4 represents the remaining $SiO_2$ after the above described etch of $SiO_2$ layer 50 of FIG. 3.

Figure 5:
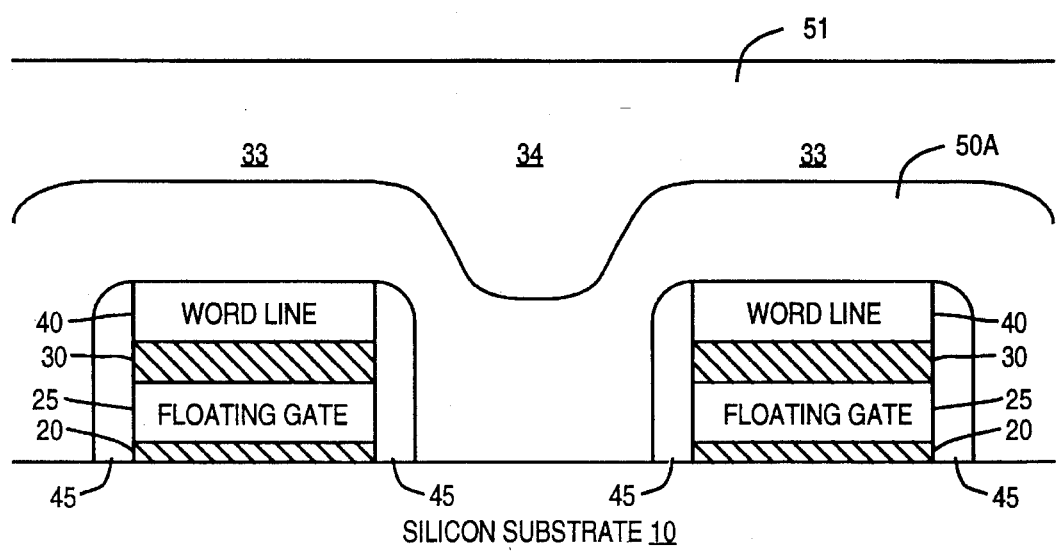
FIG. 5 is the structure of FIG. 4 after the deposition of a second silicon dioxide layer.

Next a second, thicker layer of $SiO_2$ is deposited in a PTEOS process. Referring to FIG. 5, the second PTEOS deposition of $SiO_2$ results in $SiO_2$ layer 51. In the currently preferred embodiment $SiO_2$ layer 51 is deposited to a thickness of approximately 2.5 to 3 microns. The second PTEOS deposition is carried out using the same parameters as the first deposition. Under these conditions, the deposition rate of $SiO_2$ is approximately 2,500 and 3000 Å per minute. If the spacing between adjacent word lines 40 is less than approximately 0.8 microns, $SiO_2$ layer 51 could be deposited to a thickness of approximately 1.5–2.0 microns.

As can be seen from FIG. 5, at this point in processing the upper most surface of $SiO_2$ layer 51 is relatively planar. Therefore, when the etch described below is performed, all $SiO_2$ can be removed from the surface of word lines 40 while leaving $SiO_2$ in the regions 34, since the etch proceeds at a uniform rate. In the currently preferred embodiment, a plasma etch is performed on the structure of FIG. 5. The etchback of layers 50 and 51 is performed in a mixture of carbon tetrafluoride ($CF_4$) and oxygen ($O_2$) gases to etch the $SiO_2$. Oxygen gas is flowed at a rate of approximately 40 to 60 SCCM, and $CF_4$ flows at a rate of 80 to 120 SCCM in the currently preferred embodiment. Also in the currently preferred embodiment approximately 500 to 600 watts of power are applied to the RF induction source at room temperature, while the chamber is maintained at a pressure of approximately 0.3 to 0.4 torr.

Figure 6:
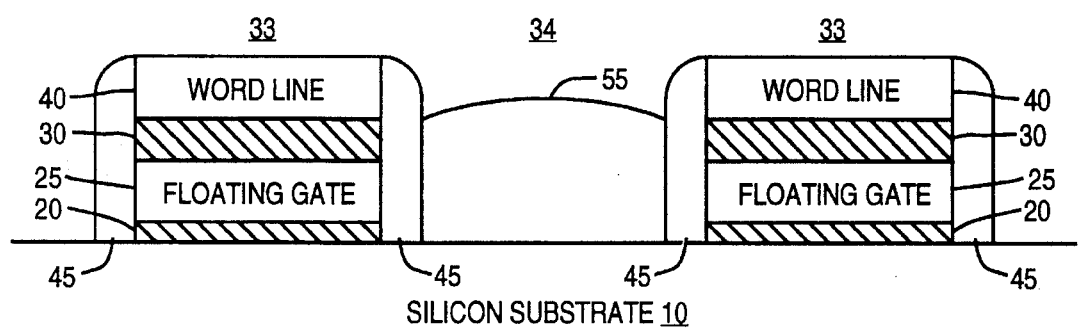
FIG. 6 is the structure of FIG. 5 after a blanket etchback of silicon dioxide.

Referring to FIG. 6, the structure of FIG. 5 is shown after the above described plasma etch. As can be seen from FIG. 6, the word lines 40 are free of $SiO_2$, while the region 34 remain filled with $SiO_2$. The filling or plug of $SiO_2$ remaining in the regions 34 is shown as plugs 55 in FIG. 6.

After the $SiO_2$ has been etched to leave word lines 40 exposed, a blanket layer of titanium (Ti) is deposited to a thickness of approximately 600–800 Å in the currently preferred embodiment. Although the currently preferred embodiment uses Ti, it would be obvious to one skilled in the art that any refractory or near noble metal could be used to lower the resistance of the word lines 40. After the Ti deposition a silicidation step is preformed. The silicidation is performed in the currently preferred embodiment by rapid thermal annealing (RTA) at a temperature of approximately 725° C. for approximately 20 seconds in a nitrogen ($N_2$) ambient. Alternatively the silicidation step could be accomplished by furnace annealing.

Figure 7:
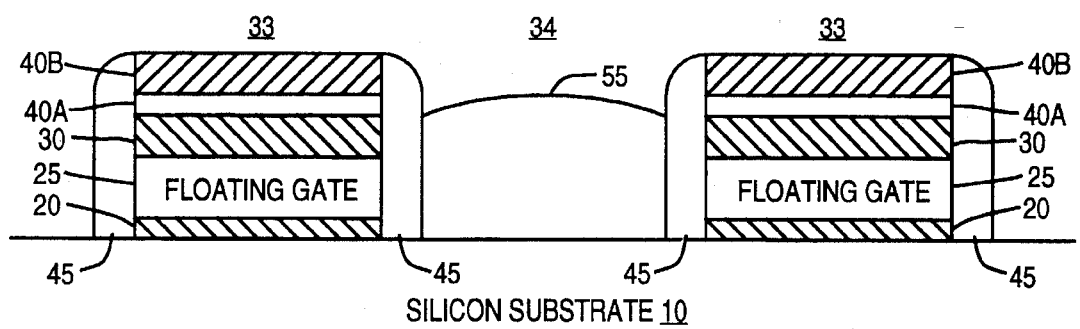
FIG. 7 is the structure of FIG. 6 after metal deposition, silicidation and etch.

After the silicidation step a selective etch is preformed to remove the remaining unreacted metal from all regions of the surface where the silicide has not been formed, for example, from all regions other than word lines 40 in the array. In the currently preferred embodiment the etch is performed by submerging the substrates 10 in a mixture of hydrogen peroxide ($H_2O_2$) ammonium hydroxide ($NH_4OH$) and water in the ratio of $H_2O_2:NH_4OH:H_2O=2:1:1$ for 20 minutes. FIG. 7 shows substrate 10 after metal deposition, silicidation, and selective etch. As can be seen from FIG. 7 the word lines 40 have been silicidized, while the regions 34 remain free of silicide due to the remaining $SiO_2$ plugs 55 of FIG. 6. As shown in FIG. 7, word lines 40 of the previous Figures have been partially silicidized. Layer 40a of FIG. 7 shows the portion of polysilicon layer 40 which is unreacted, and layer 40b of FIG. 7 shows the portion which has been silicidized to form a metal silicide. Alternatively, a complete silicidation of the word lines 40 can be performed, which would result in the entire thickness of the word lines 40 being silicidized.

Thus, a process is described for performing silicidation of the word lines on Flash contactless type EPROM or EEPROM devices. In the process of the present invention, silicidation is carried out on the word lines while being prevented on all other regions, such that source to drain shorting does not occur. Additionally, a relatively planar surface is achieved by the present invention, which is helpful in later stages of processing such as contact and metal steps.

I claim:

1. A process for forming a silicide on an array of floating gate memory devices, said array having first regions of exposed silicon where silicide is to be formed and having second regions of exposed silicon where no silicide is to be formed, said process comprising the steps of:

depositing an oxide on said array;

etching said oxide from said first regions while leaving at least a portion of said oxide in said second regions, said steps of depositing said oxide and etching said oxide from said first regions while leaving at least a portion of said oxide in said second regions being performed without use of a masking layer;

depositing metal on said array in said first regions and on said unetched portion of said oxide in said second regions;

forming a metal silicide in said first regions; and removing said metal from all regions of said array except said first regions.

2. The process as in claim 1 wherein said process of depositing metal on said array, forming a metal silicide in said first regions, and removing said metal from all regions of said array except said first regions is performed without use of a masking layer.

3. The process as in claim 1 wherein said metal comprises titanium and said metal silicide comprises titanium silicide.

4. The process as in claim 1 wherein said deposition and said etch of said oxide comprise the steps of:

depositing a first oxide layer by PECVD using TEOS as a precursor;

etching some of said first layer by sputter etch;

depositing a second oxide layer by PECVD using TEOS as a precursor; and, etching said first and said second oxide layers from said first regions while leaving some oxide in said second regions.

5. The process as in claim 4 wherein the thickness of said first oxide layer is in the range of 1000 to 5000Å, said etching of said first layer by sputter etch removes 500 to 4000Å of said first oxide layer, and said second oxide layer is deposited to a thickness of 1-4 microns.

6. The process as in claim 1 wherein the thickness of oxide remaining in said second regions after said etch is at least 200 Å.

7. The process as in claim 4 wherein the thickness of oxide remaining in said second regions after said etch is at least 200 Å.

8. The process as in claim 5 wherein the thickness of oxide remaining in said second regions after said etch is at least 200 Å.

9. The process as in claim 1 wherein said first regions of exposed silicon comprise polysilicon word lines.

10. The process as in claim 2 wherein said first regions of exposed silicon comprise polysilicon word lines.

11. The process as in claim 3 wherein said first regions of exposed silicon comprise polysilicon word lines.

12. The process as in claim 4 wherein said first regions of exposed silicon comprise polysilicon word lines.

13. The process as in claim 5 wherein said first regions of exposed silicon comprise polysilicon word lines.

14. The process as in claim 6 wherein said first regions of exposed silicon comprise polysilicon word lines.

15. The process as in claim 7 wherein said first regions of exposed silicon comprise polysilicon word lines.

16. The process as in claim 8 wherein said fast regions of exposed silicon comprise polysilicon word lines.

17. The process as described in claim 1 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

18. The process as described in claim 3 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

19. The process as described in claim 4 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

20. The process as described in claim 5 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

21. The process as described in claim 6 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

22. The process as described in claim 7 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

23. The process as described in claim 8 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

24. The process as described in claim 9 wherein said array of floating gate memory devices comprises elongated spaced apart diffusion regions, and elongated, spaced apart conductive regions disposed above and substantially perpendicular to said diffusion regions, and wherein said second regions are disposed between said diffusion regions and between said conductive regions.

* * * * *

UNITED STATES PATENT AND TRADEMARK OFFICE
CERTIFICATE OF CORRECTION

PATENT NO. : 5,470,772
DATED : November 28, 1995
INVENTOR(S) : Been-Jon Woo

It is certified that error appears in the above-indentified patent and that said Letters Patent is hereby corrected as shown below:

In column 1 at line 35 delete "an" and insert --art--

In column 5 at line 15 delete "serf-aligned" and insert --self-aligned--

Signed and Sealed this

Fifteenth Day of July, 1997

Attest:

BRUCE LEHMAN

*Attesting Officer*          *Commissioner of Patents and Trademarks*